May 23, 1961 J. L. BUIE 2,985,804

COMPOUND TRANSISTOR

Filed Feb. 8, 1960

JAMES L. BUIE
INVENTOR.

BY Spensley and Horn

ATTORNEYS

United States Patent Office 2,985,804

Patented May 23, 1961

2,985,804

COMPOUND TRANSISTOR

James L. Buie, Panorama City, Calif., assignor to Pacific Semiconductors, Inc., Culver City, Calif., a corporation of Delaware Filed Feb. 8, 1960, Ser. No. 7,193

9 Claims. (Cl. 317—235)

This invention relates to semiconductor devices and more particularly to an improved transistor capable of superior performance.

It is well-known that prior art transistors which have a high alpha, i.e., above 0.99, tend as a general rule to be unstable in typical current applications. In order to achieve stability without sacrificing circuit gain, it was heretofore necessary to cascade two transistors by connecting the base of one transistor of the emitter of a second transistor and interconnect the collectors of both transistors, thus producing a composite device which may be viewed as having one emitter contact (that of the first transistor), one collector contact (that being common to both collectors), and one base contact (that being the base contact of the second transistor). Such a circuit is known as the "Darlington Circuit."

This prior art method involving the interconnection of two or more transistors as hereinabove described requires external connections with attendant sockets, wirings, etc. The characteristics of two separate transistors may differ due to the variables which ordinarily occur in production. It would therefore be desirable to provide a transistor which includes the advantages of interconnected individual transistors without the hereinabove described attendant disadvantages. Such a device is less costly to manufacture and results in more constant and predictable output parameters.

It is therefore an object of the present invention to provide a transistor whose performance characteristics are superior to those of the prior art devices.

Another object of the present invention is to provide a transistor having improved temperature stability characteristics.

Yet another object of the present invention is to provide an improved transistor structure which approximates two cascaded individual transistors connected as hereinabove described.

The present invention transistor structure includes a semiconductor crystal body of a predetermined conductivity type which has included therein a first contiguous region of the opposite conductivity type. In one face of the region of the opposite conductivity type there are provided two regions of the same conductivity type as the parent material; these two regions are separated one from the other and are non-symmetrically disposed. One of these regions is shorted by a metal strip to the region of "opposite conductivity type." On the opposite side of the body there is provided a heavily doped region of the same conductivity type as that of the parent crystal. Connections are then made as follows: One contact is made to the heavily doped region, this being the collector contact; one contact is made to the region of opposite conductivity type and serves as the base contact; and a third contact is made to the first of the two regions of the "same" conductivity within the region of "opposite" conductivity type, this serving as the emitter. The other one of the two regions of the "same" conductivity is shorted to the region of "opposite" conductivity.

The novel features which are believed to be characteristic of the present invention, together with further objects and advantages thereof, will be better understood from the following description in which the invention is illustrated by way of example. It is to be expressly understood, however, that this description is for the purpose of illustration only and that the true spirit and scope of the invention is defined by the accompanying claims.

Figures 1, 2, 3, 4:
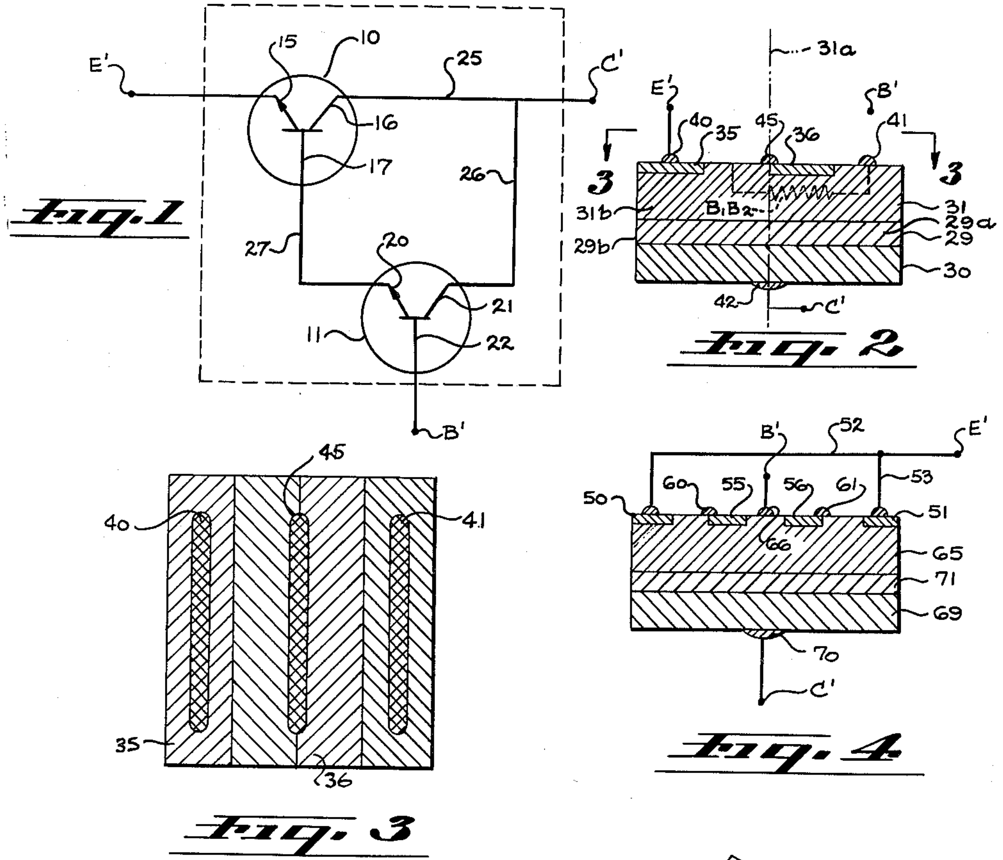
Figure 1 is a circuit diagram showing two N-P-N transistors interconnected to form a prior art Darlington Circuit.
Figure 2 is a sectional view of a composite transistor constructed in accordance with the presently preferred embodiment of this invention.
Figure 3 is a view taken along line 3—3 of Figure 2.
Figure 4 is a sectional view of an alternative embodiment of a device constructed in accordance with the present invention.

Referring now to the drawing, the transistor circuit illustrated in Figure 1 includes a first transistor 11 and a second transistor 10. Transistor 10 has an emitter 15, a collector 16 and a base 17, while transitor 11 has an emitter 20, collector 21 and a base 22. The collector 16 of transistor 10 and the collector 21 of transistor 11 are interconnected through leads 25 and 26 at terminal C′. One of the input terminals designated E′ is connected to the emitter 15 of transistor 10. The base 22 of transistor 11 is connected to terminal B′ and the base 17 of the second transistor 10 is connected to the emitter 20 of the first transistor 11 by lead 27. The composite circuit of Figure 1 may be viewed within the dotted box having external connections E′, C′, and B′ representing the emitter, collector and base, respectively. It has been found, with an arrangement as shown herein, and with an alpha of approximately 0.90 for each of the individual transistors, that an alpha′ (combined alpha) is much higher, i.e., of the order 0.99, than the alpha of the individual transistors. Further, the stability (i.e., lack of sensitivity to temperature change) has been found to be greatly increased as compared to either of the transistors taken separately.

Referring now to Figure 2, there is shown in cross-section a composite transistor device constructed in accordance with the presently preferred embodiment of this invention. The device of Figure 2 includes a parent crystal designated as 29 which serves as the collector region and which is of N-type conductivity silicon. It may be produced by a grown single silicon crystal which has been doped with arsenic in accordance with well-known practices. A heavily doped N+ conductivity region 30 is provided by diffusion of phosphorus, for example, into the lower surface of crystal 29 in order to produce a low resistance collector contact. P-type base region 31 adjacent region 29 and opposite region 30, may be produced by diffusion of boron into the upper surface of the parent crystal. Two N-type conductivity regions 35 and 36 are produced by diffusion of phosphorus, for example, into the base region 31 in accordance with well-known prior art methods. The two N-type conductivity regions 35 and 36 are separated from one another and are shown to be parallel to each other, with region 35 being at or near the corner of the crystal while region 36 is at or near the central longitudinal axis of the crystal. They both assume a generally rectangular shape when viewed as in Figure 3. In order to provide an electrical connection to the various regions which serve as the emitter, base and collector regions of the composite device, metallized strips 40, 41 and 42 are laid down on the crystal body, as may best be seen in Figures 2 and 3. A fourth metallized strip 45 is provided at the juncture between regions 36 and 31, thereby serving to short them together. The metallized strips may be produced by evaporation, chemiplating, or the like. One technique which has been used to advantage is the codeposition of gold and nickel.

Thus, it can be seen that the device of Figure 2 has three terminals, E′, C′ and B′, which are connected to regions 35, 30 and 31, respectively, and which serve as the three terminals of the device. The device of Figure 2 may be viewed as two transistors formed of a single crystal of silicon. If an imaginary vertical line designated by the numeral **31*a* were to be drawn where indicated, the two transistors would be apparent. The first transistor to correspond electrically with Figure 1 and therefore serving as transistor 11 thereof includes emitter 36, base 31 and collector 29*a*, while the second transistor includes emitter 35, base 31*b* and collector 29*b*. With a little study it will soon be apparent that the electrical connection between emitter 36 and base 31 need be on the side of the base toward emitter 35**, else one of the transistors will not have an emitter region.

The device of Figure 2 is similar to the circuit of Figure 1 except for the fact that the two bases, $B_1$ and $B_2$, are interconnected by the unitary base region 31. Stated differently, the unitary base region may be viewed as consisting of two sections separated by vertical phantom line **31*a*. This region has a finite and a relatively high resistance (indicated schematically by $B_1B_2$) relative to the normal impedance of the diode consisting of emitter 20 and base 22 of the transistor 11 of Figure 1. The value of the resistance $R_{B_1B_2}$ between the two base regions of the Figure 2 device is, in this example, at least 1000 ohms. The value of this resistance is a function of the emitter current. It must be chosen so that it will be substantially greater than (i.e., at least 10 times) the input resistance. That is to say, viewing the first transistor, there are two current-paths, one through the base emitter diode consisting of base 31 and emitter 35**, the other through $B_1B_2$. The current through the latter path should be no more than 1/10 than through the former.

Thus, it is clear that if a resistance $R_{B_1B_2}$ were to be placed between the base 17 of transistor 10 and the base 22 of transistor 11, then the circuit of Figure 1 would be substantially the equivalent of the device of Figure 2.

It is often desirable to have a transistor which presents a relatively high input impedance and a relatively low output impedance. If one were to choose two separate transistors to be interconnected as the circuit of Figure 1, there would typically be chosen one of small physical dimensions and the other of relatively large physical dimensions. The smaller transistor would be on the input side as it would present a relatively high input impedance. However, in such a two-transistor arrangement the connecting wires at high frequencies act as significant inductances, thus disturbing the power match between the two transistors.

Figure 5:
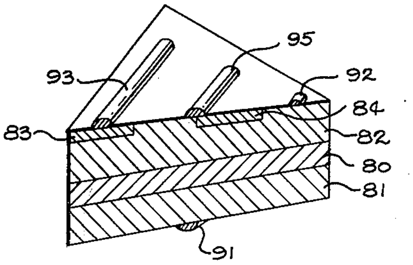
Figure 5 is a plan view of a second alternative embodiment of the device constructed in accordance with the presently preferred embodiment of this invention.

The present invention device, on the other hand, overcomes this shortcoming. As the impedance of the connection between the device is minimized, that is, no wires are used, operation at high frequency and high power may be achieved where it might otherwise be impossible. In order to maximize the advantages gained by the use of a small and large dimension transistor interconnected as has been hereinabove mentioned, a device of the configuration as shown in Figure 5 may be used. The device of Figure 5 is similar to that of Figures 1 and 2. It is however, wedge-shaped rather than rectangular when viewed from above. The parent crystal, which is of N-type conductivity silicon, is designated by the numeral 80. The N+ conductivity collector contact region is numbered 81, the base region 82 and the two emitter regions 83 and 84. The contacts to the regions numbered 81, 82 and 83 are indicated as 91, 92 and 93 respectively. A conductive strip 95 similar to strip 45 of Figure 3 serves to short the base region 82 to the emitter region 84.

Thus, the device of Figure 5 includes in effect two transistors, one of which has a smaller physical dimension than the other. The result of such a composite device is to achieve the desired goal of having a relatively small input transistor and a larger output transistor in order to optimize the power match, as when two separate transistors are interconnected at high frequencies.

Another alternative embodiment of the present invention device is shown in Figure 4. This device employs two separate emitter regions 50 and 51 which are interconnected by leads 52 and 53 to emitter contact E′. Further, there are included two additional emitter regions 55 and 56 which are shorted by metallized strips 60 and 61 to the base region 65. The base contact is made by metallized strip 66 to contact B′ while the collector contact is made to the N+ region 69 through metallized strip 70 to collector region 71. The device of Figure 4 is therefore substantially the same as that of Figures 2 and 3, but as there is a larger emitter base edge due to the presence of the additional emitter regions, greater current capacity is achieved for a device of the same overall physical dimensions than would be possible for the Figure 2 and 3 device under similar operating conditions.

The present invention involves, in part, a recognition that a short between the emitter region of the input transistor and the base region of the output transistor will result in the improved characteristics as hereinabove described. Several methods exist by which a low resistance contact may be produced between these two low regions. One such method which has been found to be particularly satisfactory is that described and claimed in co-pending U.S. patent application, Serial No. 828,613, filed July 21, 1959, entitled "Method of Making Electrical Connection in Semiconductor Bodies," by Clifford A. Levi and assigned to the assignee of the present invention, by which a nickel-gold layer is produced by the use of nickelous chloride and gold chloride in the presence of other reagents.

Figure 6:
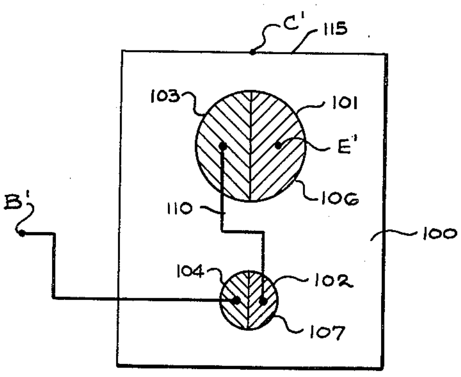
Figure 6 is a plan view of a third alternative embodiment of the device constructed in accordance with the present embodiment of the present invention.

In Figure 6 there is shown a plan view of a modified form of the present invention. Therein a unitary parent semiconductor crystal 100 has two separate emitter regions, 101 and 102, and two base regions, 103 and 104, produced by diffusion in the upper surface thereof. Each of the emitter regions, as in the Figure 2 and 3 devices, lies within and above the base regions. Unlike the Figures 2 and 3 devices the base regions do not extend over the entire surface of the parent crystal but instead are localized within two separated, generally circular regions 106 and 107 different diameters. The emitter region 102 of one of the transistors is shorted to the base region 103 of the other transistor by means of lead 110. Leads are also provided to emitter region 101, collector region 115 and base region 104, these being designated E′, C′ and B′, respectively. Thus, a composite transistor results consisting of two partially separate transistors sharing a common collector and having the base of one shorted to the emitter of the other.

By the design of the Figure 6 composite device the equivalent resistance $B_1B_2$ of the Figure 2 and 3 device is effectively eliminated and the device more clearly approximates that of the Figure 1 circuit wherein no path exists between the bases of the two interconnected transistors.

While the lead 110 which interconnects the base 103 and emitter 102 of the Figure 6 device may present a problem at high frequencies this design may, under certain conditions, offer an advantage of the devices hereinabove described. Firstly, the device of Figure 6 lends itself more readily to mass production due to relative simplicity of manufacturing cost. But more important is the fact that ordinarily it is desirable to produce a base region of low resistivity as the result of other design considerations. If the resistivity of the base region is low then the resistance $B_1B_2$ will be too low relative to the resistance through the base-emitter diode path, as was hereinabove explained. Thus, a compromise is effectively achieved by the Figure 6 device design. Therein, the base resistivity of each of the base regions 103 and 104 may be made low while the resistance between them will be infinite, as they are not in any way connected.

There has thus been described a new and improved transistor design, capable of superior performance at high frequencies over other prior art single transistors or such transistors interconnected by conventional means.

What is claimed as new is:

1. A transistor including a semiconductor crystal body comprising: a unitary region of a predetermined conductivity type within said body; at least two regions of the same conductivity type as said unitary region disposed within said body and spaced from each other and spaced from said unitary region; at least one region of the opposite conductivity type intermediate said unitary region and said at least two regions having at least a first and a second section disposed within said body, said first section forming a junction with the first of said two regions and with said unitary region, said second section forming a junction with the second of said two regions and said unitary region; electrodes in contact with said unitary region, the first of said two regions, and the second section of said region of opposite conductivity type; and means for electrically interconnecting the second of said two regions with the first section of said region of opposite conductivity type.

2. A unitary transistor device comprising: a semiconductor crystal body including a first region of a predetermined conductivity type; a second region in said body of the oposite conductivity type resulting in a junction therebetween; third and fourth regions in said body of the same conductivity type, said third and fourth regions being separated from each other by said second region, said third and fourth regions being separated from said first region by said region; an electrode in contact with each of said first region, said second region and said third region; and means for electrically interconnecting said fourth region to said second region, the interconnection occurring at that portion of the second region separating said third and fourth regions.

3. A semiconductor electrical translating device comprising: a unitary collector region of a predetermined conductivity type; at least one base region of the opposite conductivity type, said base region being adjacent said collector region resulting in a junction therebetween; at least two emitter regions of the same conductivity type, said emitter regions being spaced from each other and being adjacent said base region resulting in a junction therebetween; means for electrically interconnecting one of said emitter regions with said base region, the interconnecting occurring at that portion of said base region separating said two emitter regions; and an electrode in contact with each of said collector region, said base region and the other of said emitter regions.

4. A semiconductor electrical translating device comprising: a semiconductor crystal body including a first region of a predetermined conductivity type; a second region in said body of the opposite conductivity type resulting in a junction therebetween; at least a third and fourth region in said body of the same conductivity type, said third and fourth regions being separated from said first region by said second region, said third and fourth regions further being separated from each other; a metallized strip disposed upon a portion of said third region and a portion of said second region for electrically interconnecting them, the interconnection occurring on that portion of said third region closets to said fourth region; and an electrode in contact with each of said first region, said second region and said third region.

5. A unitary transistor device comprising: a semiconductor crystal body including a first region of a predetermined conductivity; a second region in said body of the opposite conductivity type resulting in a junction therebetween, said second region being produced by the diffusion of an active impurity into said crystal body; at least two regions of said body of the same conductivity type, said two regions being produced by diffusion of an active impurity into said second region, said two regions being separated from said first region by said second region; a metallized strip disposed upon one of said two regions and said second region for electrically interconnecting them, the interconnection occurring on the edge of said one region closest the other of said two regions; and an electrode in contact with each of said first regions, said second region and the other of said two regions.

6. A unitary transistor device comprising: an N-type collector region; at least one base region of P-type conductivity, said base region being adjacent said collector region; at least two N-type conductivity emitter regions, said emitter regions being adjacent said base region and spaced from said collector region; means for electrically interconnecting one of said emitter regions with said base region, the interconnection occurring on the edge of said one emitter region nearest the other emitter region; and an electrode in contact with each of said first region, said second region and the other of said two regions.

7. A unitary transistor device comprising: an N-type collector region; at least one base region of P-type conductivity, said base region being adjacent said collector region; at least two N-type conductivity emitter regions, said emitter regions being adjacent said base region; a first metallic strip disposed upon and interconnecting said base region and one of said emitter regions, means for electrically interconnecting one of said emitter regions with one of said base regions, the interconnection occurring on the edge of said one emitter region nearest the other emitter region; an electrode in contact with each of said first region, said second region and the other of said two regions; a third metallic strip disposed upon and in electrical contact with said base region, said third strip being separated from said first strip; and a fourth metallic strip disposed upon and in contact with the other of said emitter regions, said fourth strip being spaced from said first strip.

8. A unitary transistor device comprising: a single collector region of a predetermined conductivity type; at least one base region of the opposite conductivity type, said base region being adjacent said collector region resulting in a junction therebetween, the region between said base region and said collector region having a generally wedge-shaped elevational profile; at least two emitter regions of the same conductivity type as that of said collector region, said emitter regions being substantially parallel to each other and being adjacent said base regions resulting in a junction therebetween, one of said emitter regions being larger than the other of said emitter regions; and means for electrically interconnecting one of said emitter regions with one of said base regions.

9. A unitary transistor device comprising: a predetermined conductivity type collector region; a first and second base region of the opposite conductivity type, said base regions being adjacent said collector region and being separate one from the other resulting in junctions between said base regions and said collector regions; at least two emitter regions of the same conductivity type as that of said collector region, said emitter regions being adjacent said base regions and resulting in a junction therebetween; and means for electrically interconnecting one of said base regions with one of said emitter regions.

References Cited in the file of this patent

UNITED STATES PATENTS

| | | |
|---|---|---|
| 2,744,970 | Shockley | May 8, 1956 |
| 2,831,787 | Emeis | Apr. 22, 1958 |
| 2,875,505 | Pfann | Mar. 3, 1959 |
| 2,936,425 | Shockley | May 30, 1960 |